(12) United States Patent
Chung

(10) Patent No.: US 7,868,636 B2
(45) Date of Patent: Jan. 11, 2011

(54) PROBE CARD AND METHOD FOR FABRICATING THE SAME

(75) Inventor: In-Buhm Chung, Seoul (KR)

(73) Assignee: AMST Co., Ltd., Suwon-si (KR)

( * ) Notice: Subject to any disclaimer, the term of this patent is extended or adjusted under 35 U.S.C. 154(b) by 200 days.

(21) Appl. No.: 12/114,840

(22) Filed: May 5, 2008

(65) Prior Publication Data

US 2008/0278188 A1    Nov. 13, 2008

(30) Foreign Application Priority Data

May 11, 2007    (KR) .................. 10-2007-0046099
Aug. 31, 2007   (KR) .................. 10-2007-0088270

(51) Int. Cl.
*G01R 31/26* (2006.01)

(52) U.S. Cl. ........................................ 324/762

(58) Field of Classification Search ............ None
See application file for complete search history.

(56) References Cited

U.S. PATENT DOCUMENTS

| | | | | |
|---|---|---|---|---|
| 6,535,003 B2* | 3/2003 | Aldaz et al. | ........... | 324/754 |
| 6,911,835 B2* | 6/2005 | Chraft et al. | ........... | 324/754 |
| 7,012,442 B2* | 3/2006 | Miller | ........... | 324/754 |
| 7,061,257 B2* | 6/2006 | Khandros et al. | ........... | 324/754 |
| 7,616,016 B2* | 11/2009 | Eldridge et al. | ........... | 324/754 |
| 2003/0080764 A1* | 5/2003 | Zhou et al. | ........... | 324/758 |
| 2005/0062492 A1* | 3/2005 | Beaman et al. | ........... | 324/765 |
| 2008/0157793 A1* | 7/2008 | Chen et al. | ........... | 324/754 |
| 2008/0246501 A1* | 10/2008 | Williams et al. | ........... | 324/762 |
| 2010/0045324 A1* | 2/2010 | Beaman et al. | ........... | 324/758 |

FOREIGN PATENT DOCUMENTS

| | | |
|---|---|---|
| JP | 2005-061844 A | 3/2005 |
| KR | 2002-0014677 A | 2/2002 |
| KR | 10-0609652 | 7/2006 |
| KR | 10-2006-0087316 | 8/2006 |
| KR | 10-2006-0087316 A | 8/2006 |
| KR | 10-0674440 | 1/2007 |
| KR | 10-0683444 B1 | 2/2007 |
| KR | 20-0423446 | 8/2007 |
| WO | WO 2002/15260 A1 | 2/2002 |
| WO | WO 2006/090947 A1 | 8/2006 |

* cited by examiner

*Primary Examiner*—Jermele M Hollington
(74) *Attorney, Agent, or Firm*—NSIP Law

(57) ABSTRACT

A probe card for testing semiconductor chips on a semiconductor wafer, includes a circuit board receiving electrical signals from outside, a plurality of unit probe modules contacting the semiconductor chips on the wafer to transfer the electrical signals, a space transformer having the plurality of probe modules seated on the upper portion thereof and electrically connected to the circuit board, wherein the respective probe modules are arranged at intervals from each other on the space transformer and the space transformer has vertical apertures penetrating through it up and down, and at least one vertical conductive medium electrically connecting the respective unit probe modules and the circuit board, wherein the vertical conductive medium is arranged in the vertical apertures provided in the space transformer and the respective unit probe modules are arranged at positions spaced from the vertical conductive medium.

18 Claims, 18 Drawing Sheets

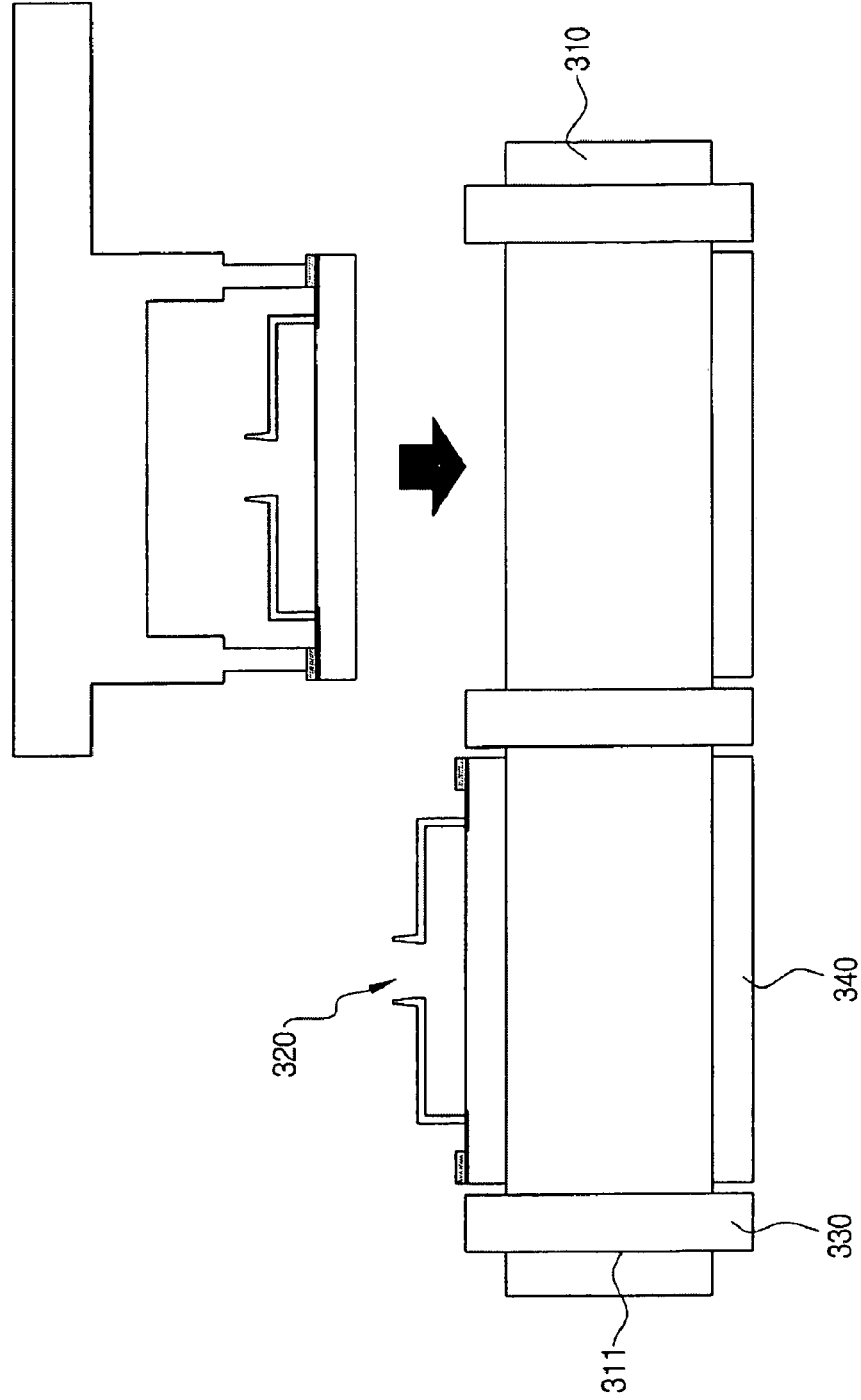

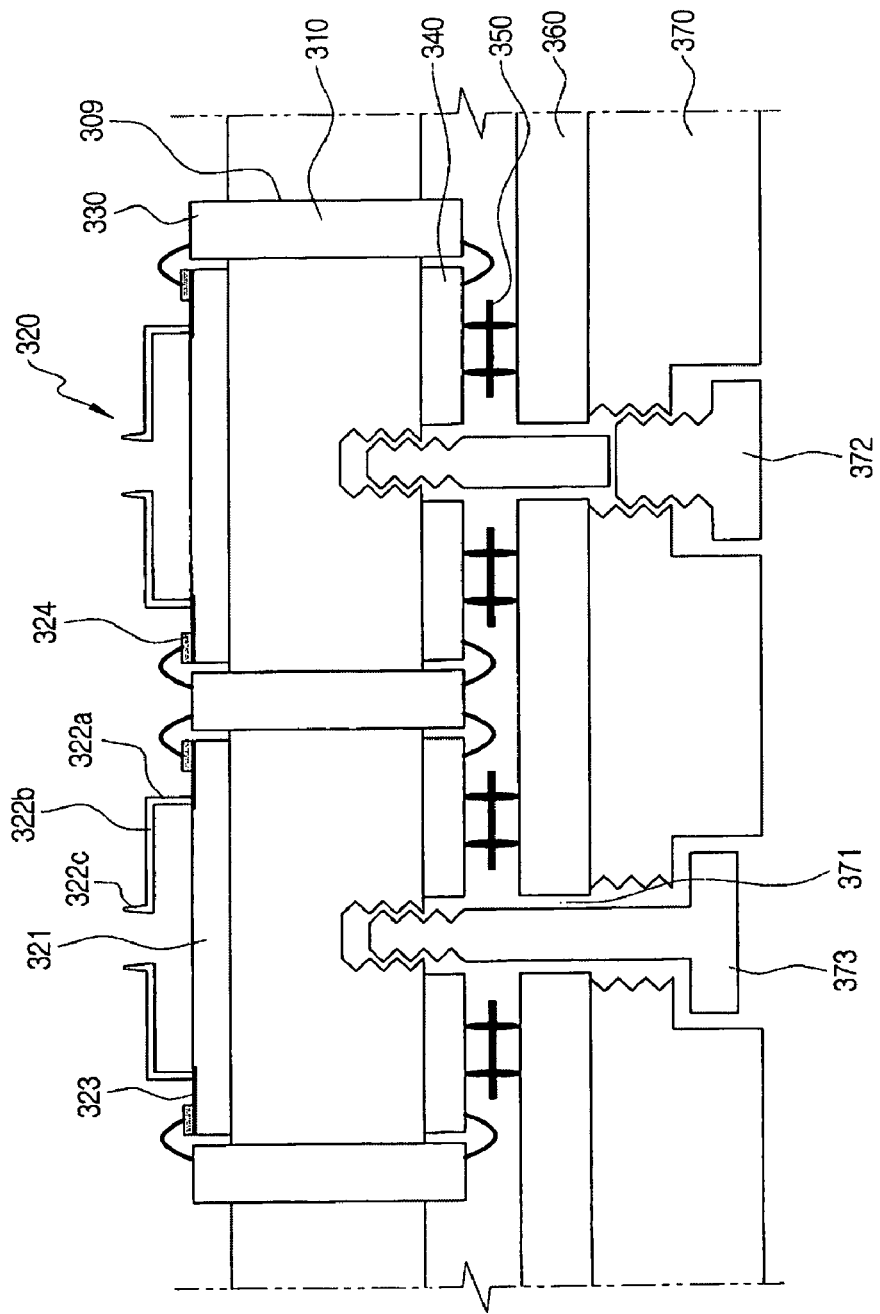

US 7,868,636 B2

PROBE CARD AND METHOD FOR FABRICATING THE SAME

CROSS-REFERENCE TO RELATED APPLICATION

This application claims the benefit under 35 U.S.C. §119 (a) of a Korean Application No. 10-2007-0046099, filed on May 11, 2007 in the Korean Intellectual Property Office, and a Korean Application No. 10-2007-0088270, filed on Aug. 31, 2007 in the Korean Intellectual Property Office, the entire disclosure of which are hereby incorporated by reference.

TECHNICAL FIELD

The following description relates a probe card and a method for fabricating the same, and more specifically to a probe card and a method for fabricating the same capable of, for example, minimizing process defect and improving thermal deformation, flatness, and alignment precision by fabricating probe modules in a chip unit size or comparable size and mounting them on a large area space transformer.

BACKGROUND

Generally, a process for manufacturing a semiconductor is largely divided into a front-end process and a back-end process. The front-end process, which is a fabrication process, is a process for forming an integrated circuit pattern on a wafer. The back-end process, which is an assembly process, is a process for forming an integrated circuit package by dividing the wafer into a plurality of chips, connecting a conductive lead or ball to each chip so as to provide electrical path to external devices and then molding the chips with epoxy, etc.

Prior to performing the assembly process, an electrical die sorting (EDS) process for testing the electrical characteristics of each chip is carried out. Defective chips are discriminated during the EDS process. Of the defective chips, reparable chips are repaired and irreparable chips are removed. As a result, it is possible to save time and cost in the following assembly process.

Such EDS process is performed in a probe station. The probe station usually consists of a probe chuck on which the wafer to be tested is seated and a test head having a probe card. A plurality of probes are provided on the probe card, wherein the probes electrically contact pads provided on the respective chips on the wafer so that they can check whether the corresponding chips are defective.

As the semiconductor technology develops, more chips are formed on a single wafer in order to reduce the manufacturing cost and improve the productivity. Recently, with the realization of a 300 mm wafer process, the increase in the number of chips per wafer is accelerated. Therefore, the development of the large area probe card becomes important in the wafer test field.

The conventional probe card for testing the large area wafer may be categorized into the substrate type and the block type from the vantage point of the space transformer. The substrate type, which is a type providing a plurality of probes 102 on a space transformer 101, for example, a ceramic substrate, with a size corresponding to the wafer to be tested (FIG. 1), has advantages in facilitating the subsequent assembly of the space transformer and stably maintaining the probe alignment. However, unlike a general ceramic substrate, the ceramic substrate for the space transformer, which is a substrate having metal lines for providing electrical connection between the probe and the circuit board, is difficult to fabricate. Therefore, the fabricating cost is high. The problem of the ceramic substrate for the space transformer becomes more serious as the area of the substrate increases. At present, the production of a ceramic substrate for the space transformer corresponding to a 300 mm wafer has not been made yet.

Meanwhile, the block type is a type fabricating the large area probe card by dividing the area to be tested into multiple blocks 202, mounting the plurality of probes 203 on the respective blocks 202 and then precisely aligning the respective blocks 202 on a block fixing frame 201, as shown in FIG. 2. Considering the fabricating process, the block type has an advantage that it is possible to replace only the corresponding block when a problem occurs during the fabricating process or during the use. However, as the area to be tested increases, the number of blocks and the length of block to be precisely aligned are increased, too. Therefore, it has the problems that much time is spent to precisely align the blocks in addition to the fact that the alignment of the blocks may deteriorate during the test.

SUMMARY

According to an aspect, there is provided a probe card and a method for fabricating the same capable of minimizing process defect and improving thermal deformation, flatness, and alignment precision by fabricating probe modules in a chip unit size or comparable size and mounting them on a large area space transformer having vertical conductive medium.

Other features will become apparent to those skilled in the art from the following detailed description, which, taken in conjunction with the attached drawings, discloses exemplary embodiments of the invention.

BRIEF DESCRIPTION OF THE DRAWINGS

FIGS. 12, 13a to 13c, and 14a to 14c are process reference views for explaining a method for fabricating a probe card according to an exemplary embodiment.

Throughout the drawings and the detailed description, the same drawing reference numerals will be understood to refer to the same elements, features, and structures.

DETAILED DESCRIPTION

The following detailed description is provided to assist the reader in gaining a comprehensive understanding of the methods, apparatuses and/or systems described herein. Accordingly, various changes, modifications, and equivalents of the systems, apparatuses and/or methods described herein will be suggested to those of ordinary skill in the art. Also, descriptions of well-known functions and constructions are omitted to increase clarity and conciseness.

Figure 1:
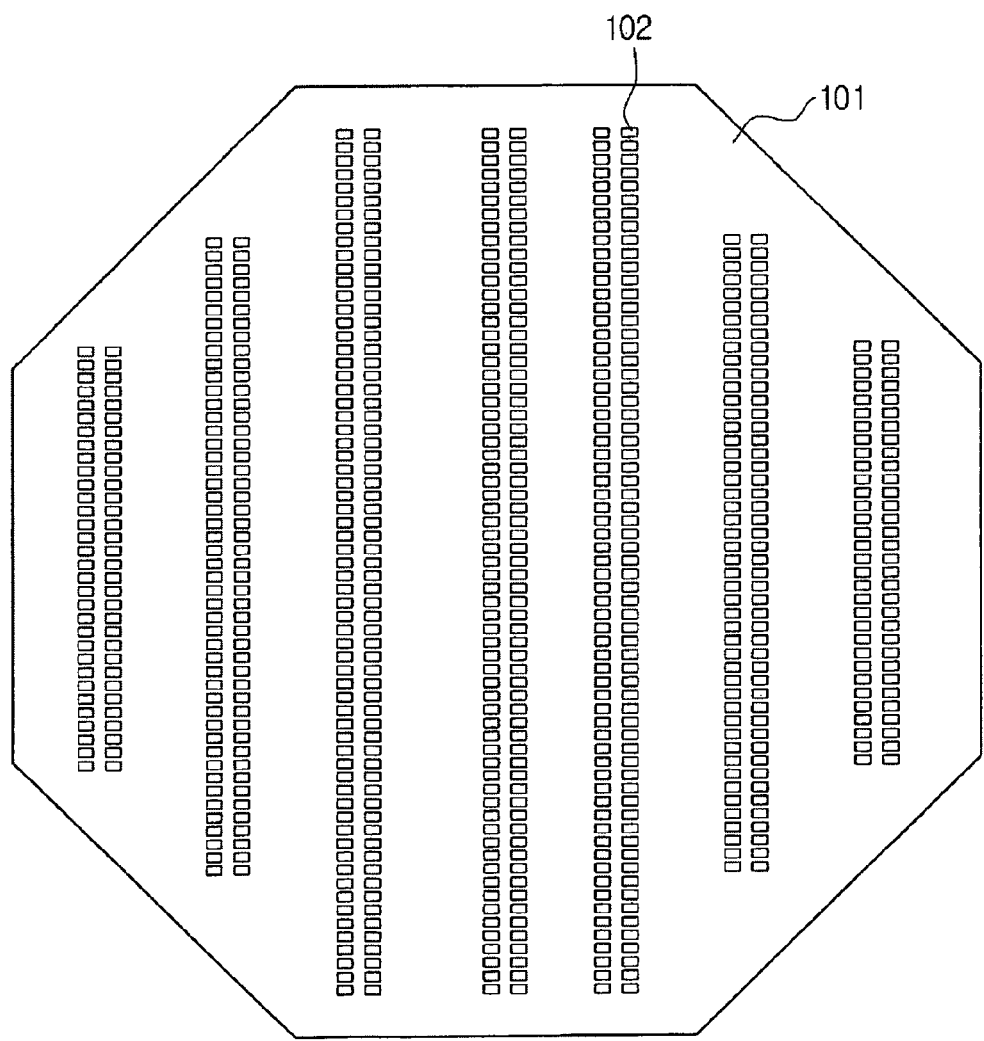
FIG. 1 is a plan view of a probe card according to a prior art.
Figure 2:
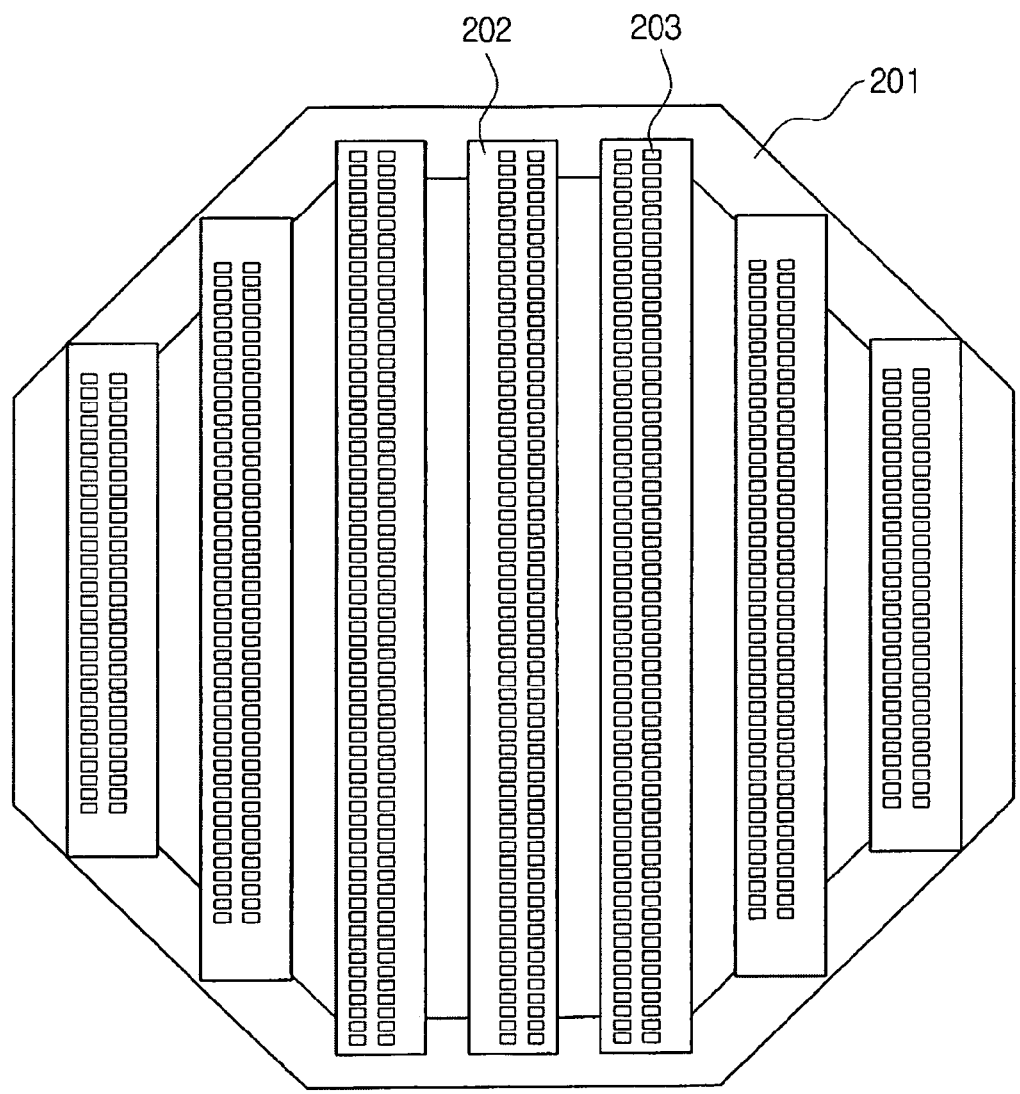
FIG. 2 is a plan view of a probe card according to another prior art.
Figure 3:
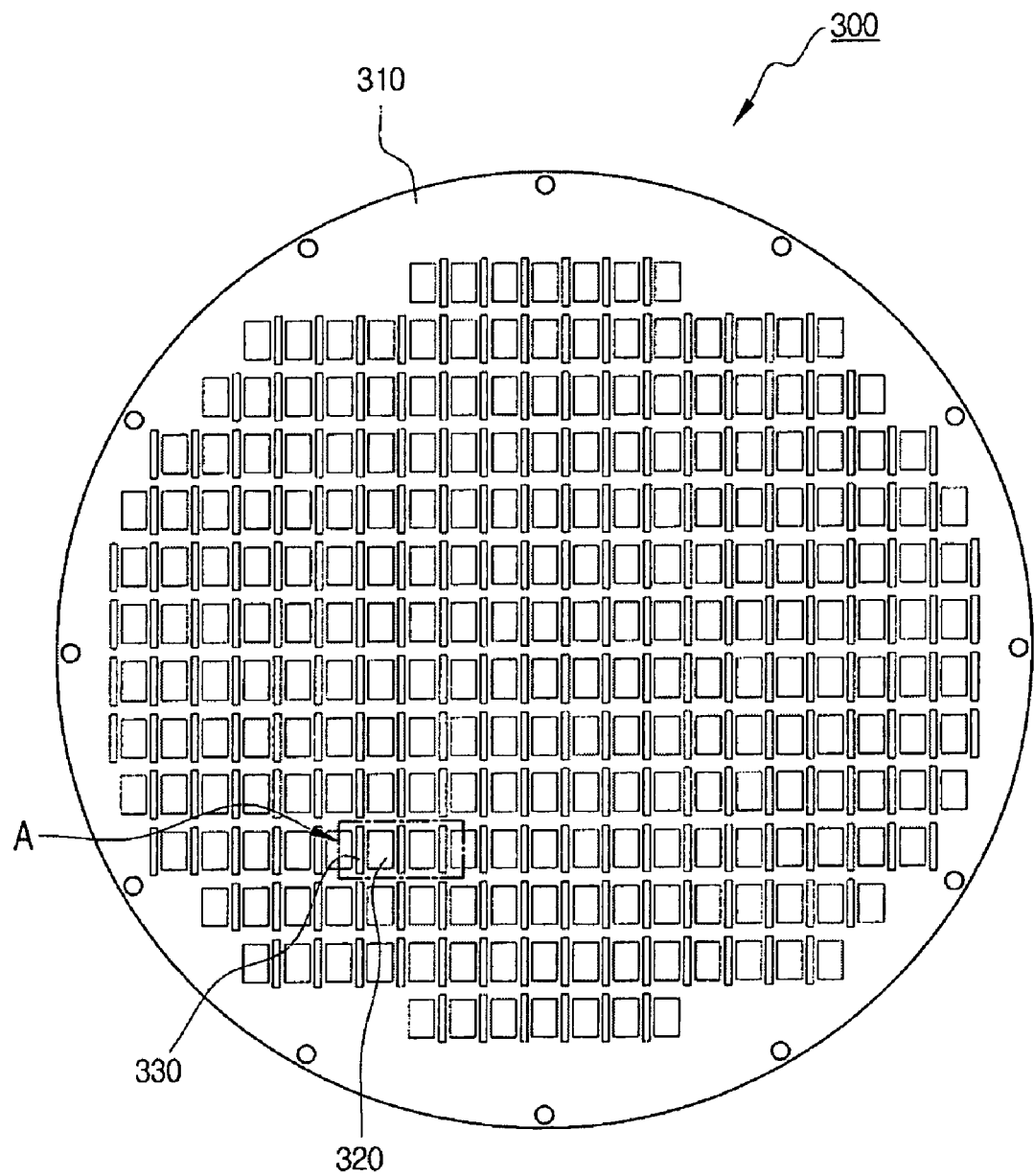
FIG. 3 is a plan view of a probe card according to an exemplary embodiment.
Figure 4:
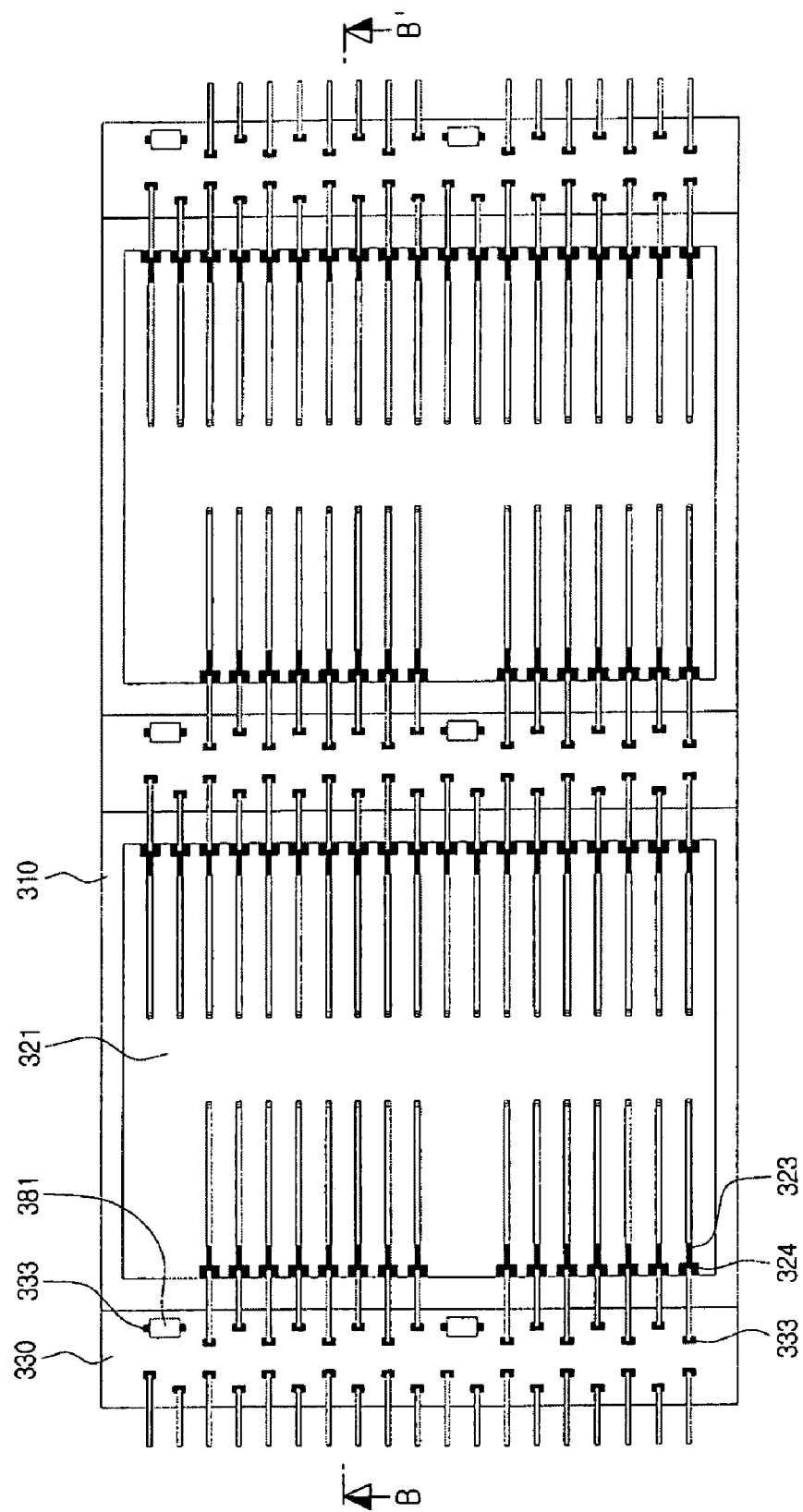
FIG. 4 is an enlarged plan view of portion A of FIG. 3.
Figure 5:
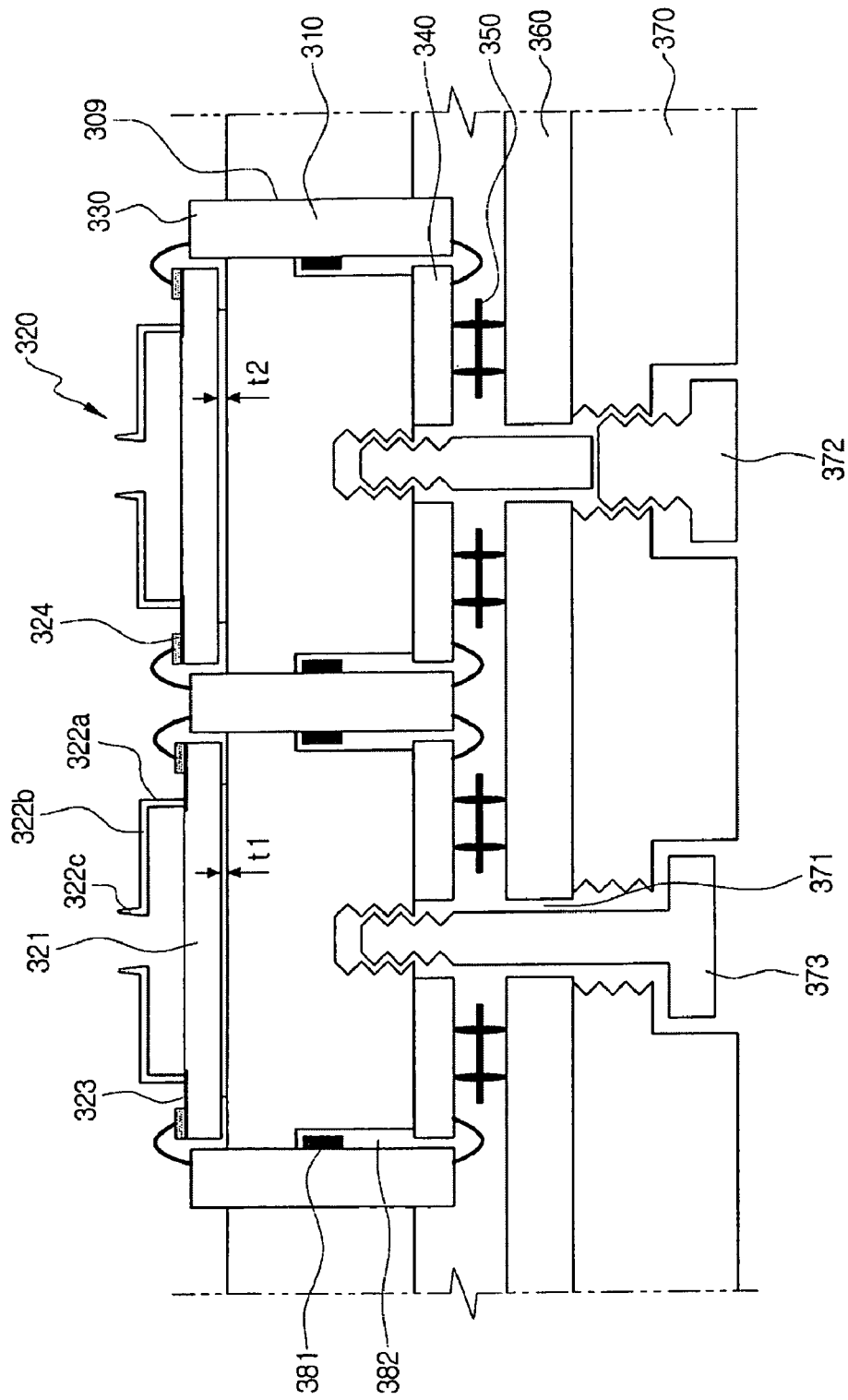
FIG. 5 is a cross-sectional view taken along line B-B' of FIG. 4.
Figure 6:
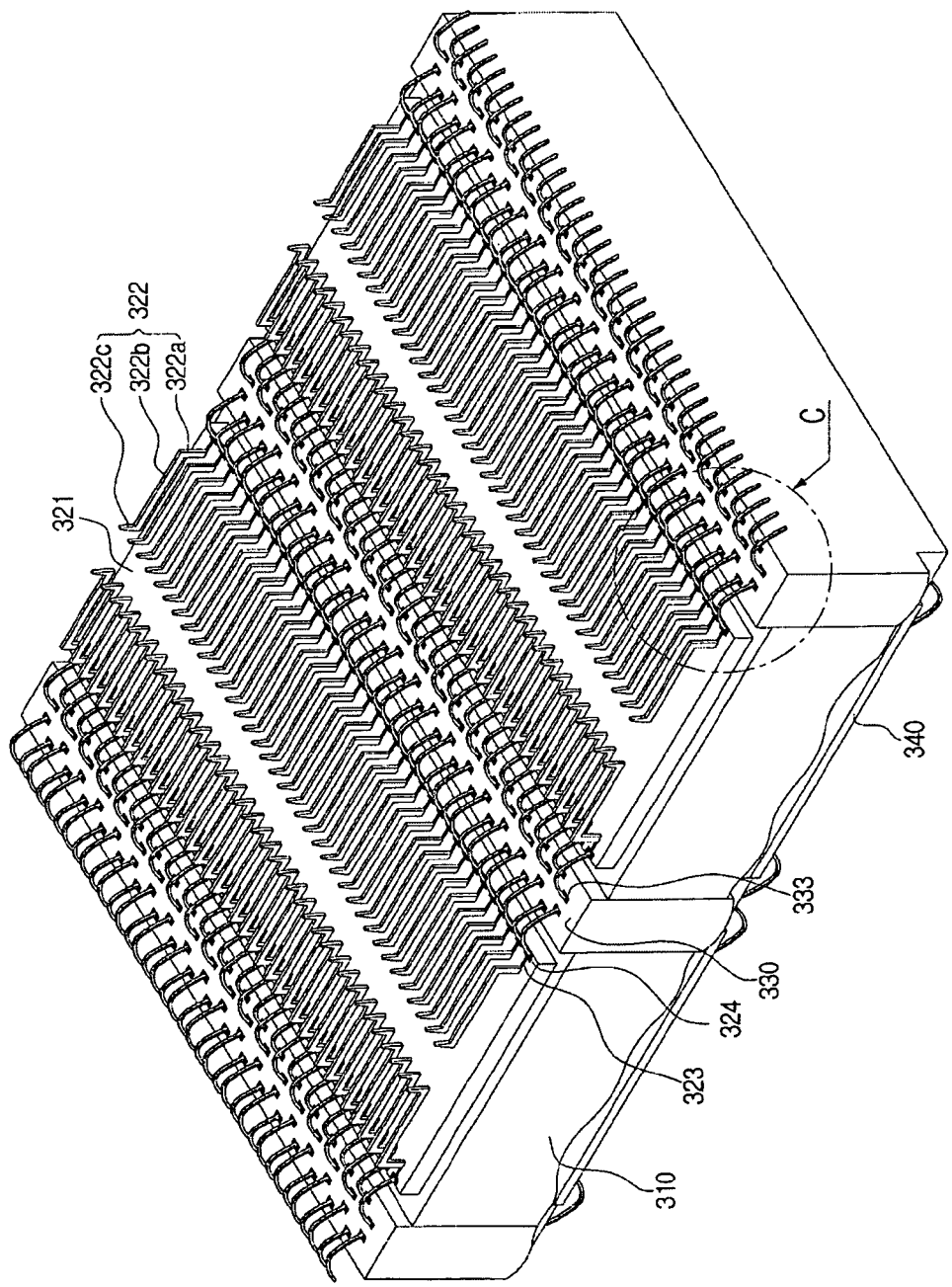
FIG. 6 is a perspective view of FIG. 4.
Figure 7:
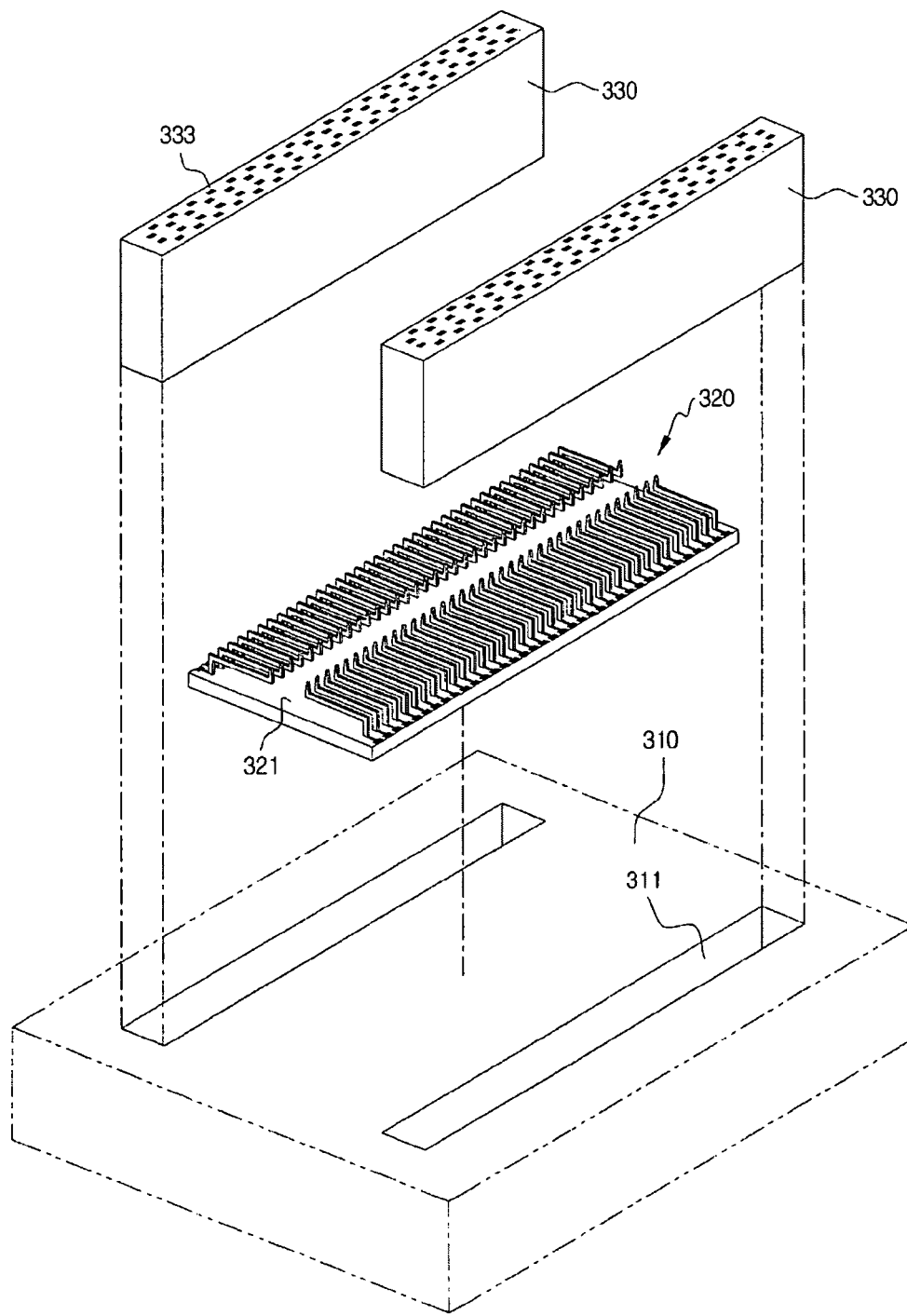
FIG. 7 is a divided perspective view of FIG. 6.
Figure 8:
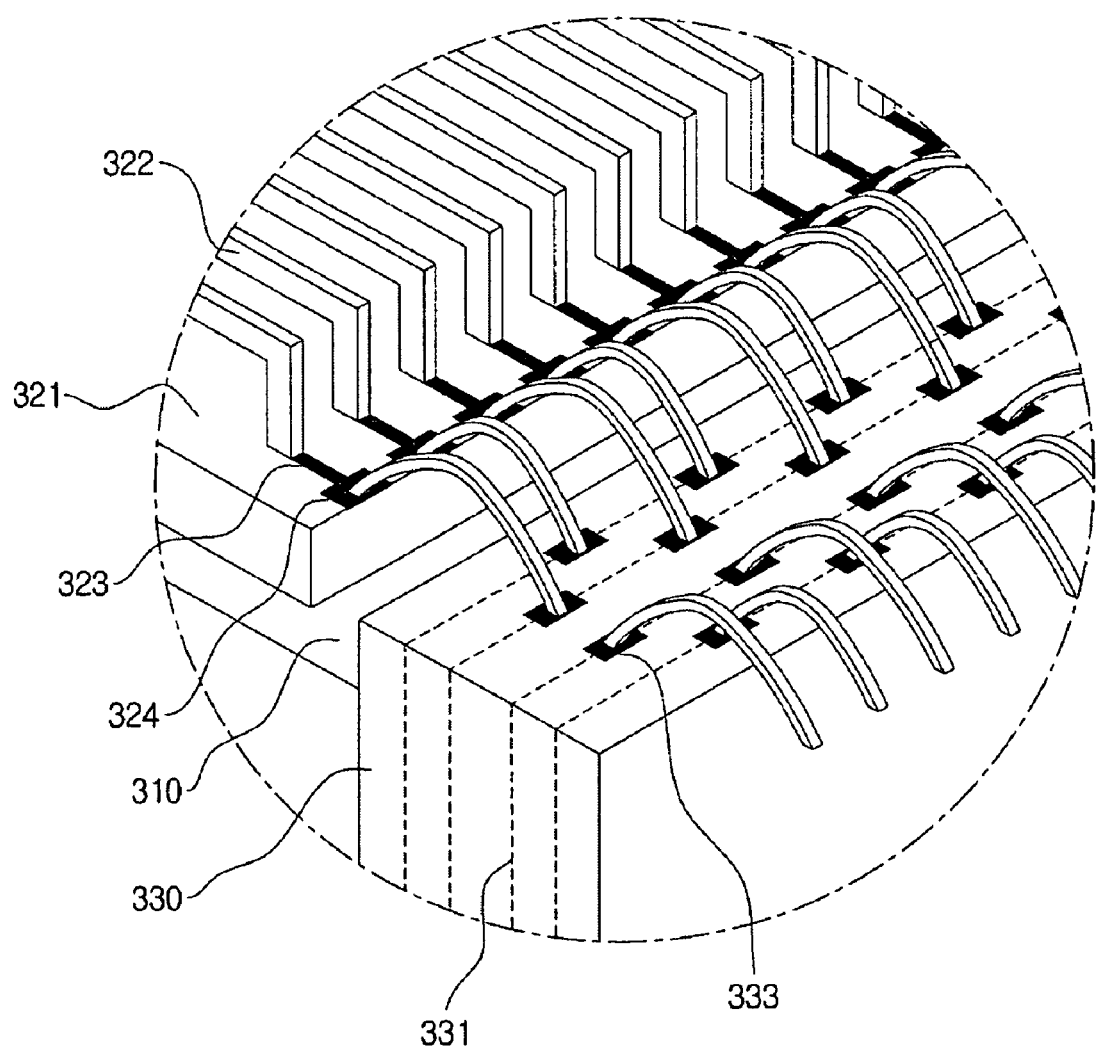
FIG. 8 is an enlarged view of C portion of FIG. 6.
Figure 9:
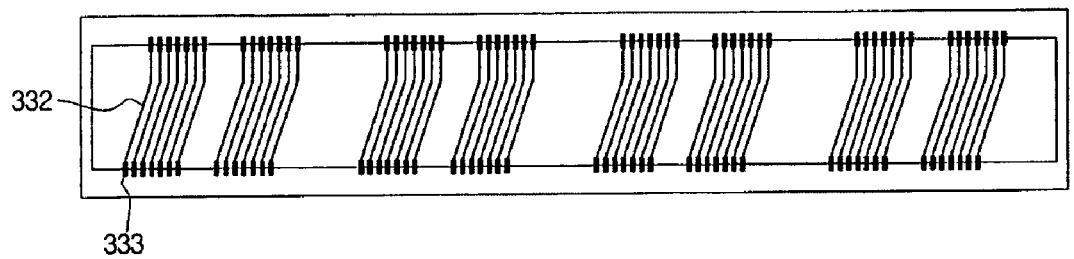
FIG. 9 is a plan view of an exemplary side-positioned printed circuit board.
Figure 10:
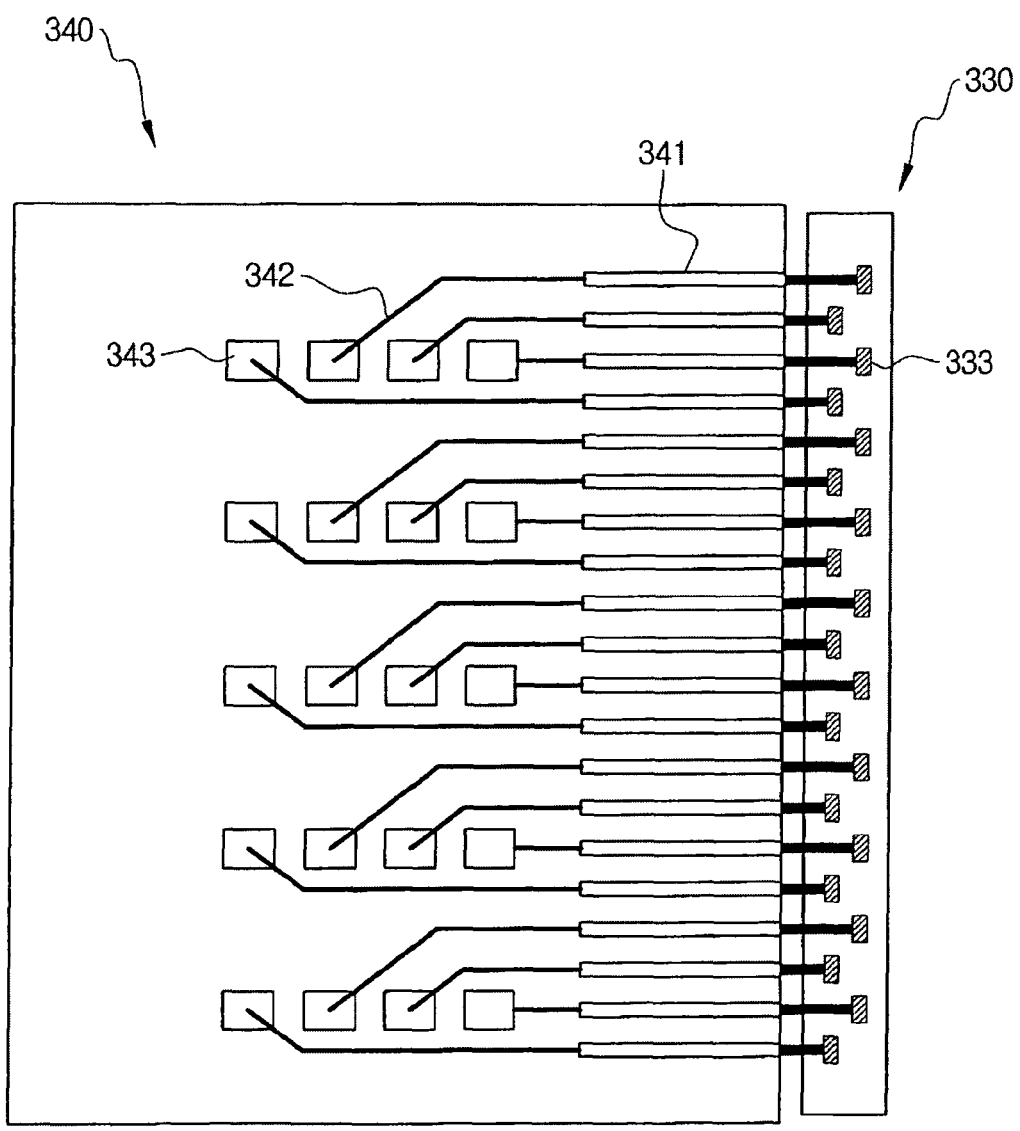
FIG. 10 is a plan view of a lower-surface printed circuit board according to an exemplary embodiment.

FIG. 3 is a plan view of a probe card according to an exemplary embodiment. FIG. 4 is an enlarged plan view of portion A of FIG. 3. FIG. 5 is a cross-sectional view taken along line B-B' of FIG. 4. FIG. 6 is a perspective view of FIG. 4. FIG. 7 is a divided perspective view of FIG. 6. FIG. 8 is an enlarged view of C portion of FIG. 6. FIG. 9 is a plan view of an exemplary side-positioned printed circuit board. And, FIG. 10 is a plan view of a lower-surface printed circuit board according to an exemplary embodiment An exemplary probe card will be described with reference to FIGS. 3 to 10.

As shown in FIG. 5, the probe card 300 according to an exemplary embodiment has a form wherein a circuit board 360 and a space transformer 310 are sequentially stacked. Unit probe modules 320 contacting semiconductor chips (not shown) to be tested are provided on the space transformer 310. Electrical signals to and from the semiconductor chips through the contact of the unit probe modules 320 are transferred to the circuit board 360. Interposers 350 are further provided between the circuit board 360 and the space transformer 310 and a stiffener plate 370 is further provided on the rear surface of the circuit board 360.

The probe card constituted by the combination of the circuit board 360 and the space transformer 310 according to the exemplary embodiment provides one or more of the following advantages. Firstly, the space transformer 310 has an area corresponding to the area of the wafer to be tested, making it possible to facilitate the subsequent assembly; secondly, the unit probe module 320 provided on the space transformer 310 has a size corresponding to the size of the semiconductor chip or has a size corresponding to 20 to 1000% of the size of the semiconductor chip; and thirdly, a plurality of vertical conductive media 330 are provided in the space transformer 310 and each of the vertical conductive medium 330 mediate the electrical connection between the unit probe module 310 and the circuit board 360.

Specifically, the space transformer 310 of the probe card according to an exemplary embodiment has a size corresponding to the area of the semiconductor wafer to be tested, as shown in FIG. 3. A plurality of unit probe modules 320 are arranged with intervals on the space transformer 310. Herein, the plurality of unit probe modules 320 may be repeatedly arranged to be spaced with predetermined intervals.

At the positions spaced from each of the unit probe modules 320, vertical apertures 311 are created at predetermined intervals, as shown in FIG. 7. The vertical apertures 311 penetrate the space transformer 310 up and down vertically or slantly and the vertical conductive medium 330 is mounted in the vertical apertures 311, as shown in FIGS. 6 and 7. The number of the unit probe modules 320 provided between the vertical conductive medium 330 may be one or more. In other words, one or a plurality of unit probe modules 320 may be commonly connected to a particular vertical conductive medium 330.

The vertical apertures 311 may be provided at a position spaced from at least one side surface of the four side surfaces of the unit probe module 320, that is, the up, down, left and right surfaces thereof. In other words, the vertical aperture 311 may be formed at one side or two sides of the unit probe module 320 or formed at positions spaced from three side surfaces or four side surfaces. For convenience of explanation, an exemplary implementation will be described below based on the fact that the vertical apertures are formed at two sides of the unit probe module 320.

Meanwhile, the space transformer 310 may be formed using any one of stainless steel, aluminum, Invar, Kovar, Nobinite, SKD11, alumina, glass, and machinable ceramic. In the case where the space transformer 310 is formed of a metallic material, the vertical aperture 311 may be formed by drill machining or wire discharge machining, etc. In the case where the space transformer 310 is formed of a ceramic material, the vertical aperture 311 may be formed by drill machining, laser machining, or micro sandblast machining, etc.

According to an aspect, the unit probe module 320 provided on the space transformer 310 has a size corresponding to the size of the semiconductor chip or a size corresponding to 20 to 1000% of the semiconductor chip. If the size of the unit probe module 320 becomes larger, the fabricating cost for the unit probe module increases and its yield decreases, but the assembly of the probe card becomes easier. If the size of the unit probe module 320 becomes smaller, the fabricating cost for the unit probe module decreases and its yield increases; but the assembly of the probe card becomes complicated. Accordingly, according to an exemplary embodiment, the unit probe module 320 may be fabricated so as to have a size corresponding to the size of the semiconductor chip or a size corresponding to 20 to 1000% of the semiconductor chip, in consideration of the above regarding the size of the unit probe module 320.

The unit probe module 320 is constituted by an insulating probe body 321 and micro cantilevers 322 provided on the probe body 321, as shown in FIGS. 5 and 6. The micro cantilever 322 is constituted by a pillar 322a, a beam 322b, and a tip 322c and plays a role of contacting the tip 321c to a pad of the semiconductor chip to be tested. In addition to the micro cantilevers 322, metal lines 323 and pads 324 for transferring an electrical signal generated by the contact of the micro cantilevers 322 and the semiconductor chip to the circuit board 360 are provided on the upper surface of the probe body 321.

As described above, the electrical signal to and from the semiconductor chip are transferred through the circuit board 360. At this time, vertical conductive medium 330 plays the role of a primary medium of electrical transfer between the unit probe module 320 and the circuit board 360. The electrical signals transferred to the vertical conductive medium 330 are ultimately transferred to the circuit board 360 via the lower-surface conductive medium 340 and the interposer 350 inserted between the lower surface of the space transformer 310 and the circuit board 360. The description of the lower-surface conductive medium 340 will be given below.

The constitution and role of the vertical conductive medium 330 will be described as follows. First, the vertical conductive medium 330 may be implemented by a printed circuit board as one implementation. Hereinafter, the vertical conductive medium 330 is referred to as a side-positioned printed circuit board 330 for convenience of explanation.

The side-positioned printed circuit board 330 has a conductive pattern 332 formed therein, wherein both ends of the conductive pattern 332 are exposed to the outside, as shown in FIG. 9. Bonding pads 333 are provided on both ends of the conductive pattern 332 to facilitate wire bonding with the pad 324 of the unit probe module 320 or with a bonding pad 341 of the lower-surface printed circuit board 340.

The side-positioned printed circuit board 330 may be fabricated by a known general method for fabricating a printed circuit board. The general fabricating method is well known and, thus, only the structure of the side-surface printed circuit board will be described in order to help the understanding the exemplary embodiment. As shown in FIG. 8, the side-positioned printed circuit board 330 has a structure of a multi-layer printed circuit board which is sequential stacking of a plurality of insulating substrates 331, wherein the conductive patterns 332 are provided on the respective insulating substrates 331. As such, there is an interface between the insulating substrates 331 by having a structure wherein the plurality of insulating substrates 331 are stacked, however, the interface does not exist in the multi-layer printed circuit board ultimately fabricated since heat and pressure are applied in the subsequent processes. In FIG. 8, a portion indicated by a dotted line indicates the interface between the insulating substrates 331; however, it does not actually exist and is indicated for the convenience of understanding in order to indicate that it consists of the plurality of insulating substrates 331.

Although both ends of the conductive pattern 332 of the side-positioned printed circuit board 330 are indicated as provided with the bonding pads 333; in the case where a cross sectional area of the conductive pattern 332 is sufficient for the wire bonding, the bonding pads 333 may be not created. In this case, both ends of the conductive pattern 332 play the role of the bonding pads 333. On the other hand, in the case where the bonding pads 333 are required at both ends of the conductive patterns 332, a conductive material is deposited on both ends of the conductive pattern 332 through processes such as metal plating, thereby making it possible to form the bonding pads 333. In this case, if the thickness of the deposited conductive material is larger than a certain thickness, the surface of the bonding pad 333 does not have a flat shape but has a convex shape, and in such case, the surface of the bonding pad 333 may be flattened by means of a grinding process. According to an aspect, the area of the bonding pad 333 has an area sufficient for performing one or plurality of wire bondings.

The side-positioned printed circuit board 330 may comprise the plurality of insulating substrates 331 so to form more bonding pads 333 on the side-positioned printed circuit board 330. For example, in the case where the side-positioned printed circuit board 330 comprises a single or two insulating substrates 331, the number of the bonding pads 333 provided on the corresponding side-surface printed circuit board may be limited considering the minimum distance between the bonding pads 333 because the bonding pads 333 are created only in one line. On the other hand, in the case where the side-positioned printed circuit board 330 comprises 3 to 20 insulating substrates 331, the distance between the bonding pads 333 may be assured because the bonding pad is arrayed in multiple rows on the side-positioned printed circuit board 330 since the bonding pads 333 are created at the interfaces of the insulating substrates 331. As a result, relatively more bonding pads 333 may be formed as compared to the case of the side-positioned printed circuit board 330 comprising a single or two insulating substrates 331. The increase in the number of the bonding pads 333 means that they may be connected to more micro cantilevers 322. Consequently, this serves as an advantage in employing a probe card with a large number of probes. According to an aspect, in order to form more bonding pads 333, the conductive patterns 332 provided at the interfaces of the insulating substrates 331 are not provided at positions corresponding to the conductive patterns 332 provided at the interfaces adjacent thereto, but are arranged in a zigzag direction. Also, in addition to the side-positioned printed circuit board 330 comprising 3 to 20 insulating substrates 331, the side-positioned printed circuit board 330 may comprise of the insulating substrates 331 in a single layer or a double layer.

The bonding pad 333 at one surface of the side-positioned printed circuit board 330 is electrically connected to the pad 324 of the unit probe module 320 through wire bonding. The bonding pads 333 provided at the opposite surface of the side-positioned printed circuit board 330 are wire-bonded to the lower-surface conductive medium 340 provided at the lower surface of the space transformer 310.

Capacitors 381 may be installed on the bonding pads 333 of the side-positioned printed circuit board 330, as shown in FIG. 4. According to an aspect, the capacitor 381 is attached on the bonding pad 333 of the upper surface of the side-positioned printed circuit board 330 positioned adjacent to the micro cantilevers 322 of the unit probe module 320, in consideration of maximizing the noise attenuating effect of the capacitor or capacitors in the electrical signal transferred to the circuit board 360 from the unit probe module 320. According to an aspect, when the capacitor is mounted on the bonding pad 333, the corresponding bonding pad need not be wire-bonded to the pad of the unit probe module.

Also, the capacitor 381 may be provided on the side surface of the side-positioned printed circuit board 330 as shown in FIG. 5. In this case, a capacitor groove part 382 may be provided in the space transformer 310 at a position corresponding to the capacitor 381. The capacitor groove part 382 provides space in which the capacitor 381 is positioned, when the space transformer 310 is combined with the side-positioned printed circuit board 330.

Up to now, the constitution and role of the vertical conductive medium 330, i.e., the side-positioned printed circuit board 330 was described. Meanwhile, as described above, the lower-surface conductive medium 340 is provided at the lower surface of the space transformer 310, wherein the lower-surface conductive medium 340 may be realized by a printed circuit board as in the vertical conductive medium 330. For the convenience of explanation, the lower-surface conductive medium 340 is referred to as the lower-surface printed circuit board 340 in the following description.

The lower-surface printed circuit board 340 is provided on the lower surface of the space transformer 310 as shown in FIG. 5, and the plurality of bonding pads 341 wire-bonded to the bonding pads 333 of the side-positioned printed circuit board 330 and a plurality of lands 343 contacting and connected to the interposers 350 are provided on the lower-surface printed circuit board 340 310, as shown in FIG. 10. The bonding pads 341 and the lands 343 are electrically connected to each other by means of a conductive material 342.

Up to now, the vertical conductive medium 330 and the lower-surface conductive medium 340 according exemplary embodiments were described. The electrical connection between the unit probe module 320 and the circuit board 360 may be assured stably without needing to extend the micro cantilever 322 or a needle, using the vertical and lower-surface conductive media. Also, signal integrity between the tester and the wafer to be tested may be increased using the impedance-matched printed circuit board as an implementation of the vertical conductive medium 330 and the lower-surface conductive medium 340.

The interposer 350, the circuit board 360, and the stiffener plate 370 are provided on the rear surface of space transformer 310, as described above. The interposer 350 plays a role of mediating the electrical connection between the lower-surface conductive medium 340 and the circuit board 360, and the circuit board 360 plays a role of transferring the electrical signal from the tester located outside to the unit probe module 320 or the signal generated by the semiconductor chip from the unit probe module 320 to the tester. Herein, the interposer 350 may be formed of a pogo pin or a pressure conductive rubber (PCR).

Meanwhile, the stiffener plate 370 is provided on the rear surface of the circuit board 360 to play a role of physically coupling and supporting the space transformer 310, the interposer 350, and the circuit board 360. The stiffener plate may be formed in a stacked structure and may be made of one of stainless steel, aluminum, Invar, Kovar, Nobinite, and SKD11 and a combination thereof.

Also, each of the stiffener plate 370, the circuit board 360, the interposer 350, and the space transformer 310 is provided with a plurality of apertures 371. The apertures 371 provided in each of the stiffener plate 370, the circuit board 360, the interposer 350, and the space transformer 310 are provided at positions corresponding to each other. The apertures 371 completely penetrate through the stiffener plate 370, the circuit board 360 and the interposer 350, and partly penetrate through the space transformer 310. Preferably, screw threads are formed in the apertures 371 formed in the space transformer 310 and the stiffener plate 370 so that the space transformer 310 and the stiffener plate 370 are coupled with the pulling screws 373 or the pushing screws 372.

The pulling screws 373 or the pushing screws 372 are provided in the respective apertures 371, wherein the pulling screws 373 and the pushing screws 372 may be alternately provided in the apertures 371 and the pulling screws 373 and the pushing screws 372 may be selectively provided. When the pulling screws 373 and the pushing screws 372 are provided in the plurality of apertures 371, the pulling screws 373 or the pushing screws 372 are selectively operated so that they may push or pull the space transformer 310 up or down. With this, the deformation of the space transformer 310 is prevented so that the flatness of the space transformer 310 may be maintained constantly.

While the description of the constitution of the probe card according to according to an exemplary embodiment has been made with the size of the space transformer corresponding to the size of the semiconductor wafer to be tested, it is understood that this is only exemplary, and that a probe card having a space transformer smaller than the size of a semiconductor wafer to be tested may have the same constitution as the exemplary embodiment and falling within the scope disclosed herein. Also, while it has been disclosed that the unit probe modules 320 provided on the space transformer are repeatedly arranged, it too is only exemplary, and it will apparent to those skilled in the art that unit probe modules may be freely provided at desired positions.

Figure 11:
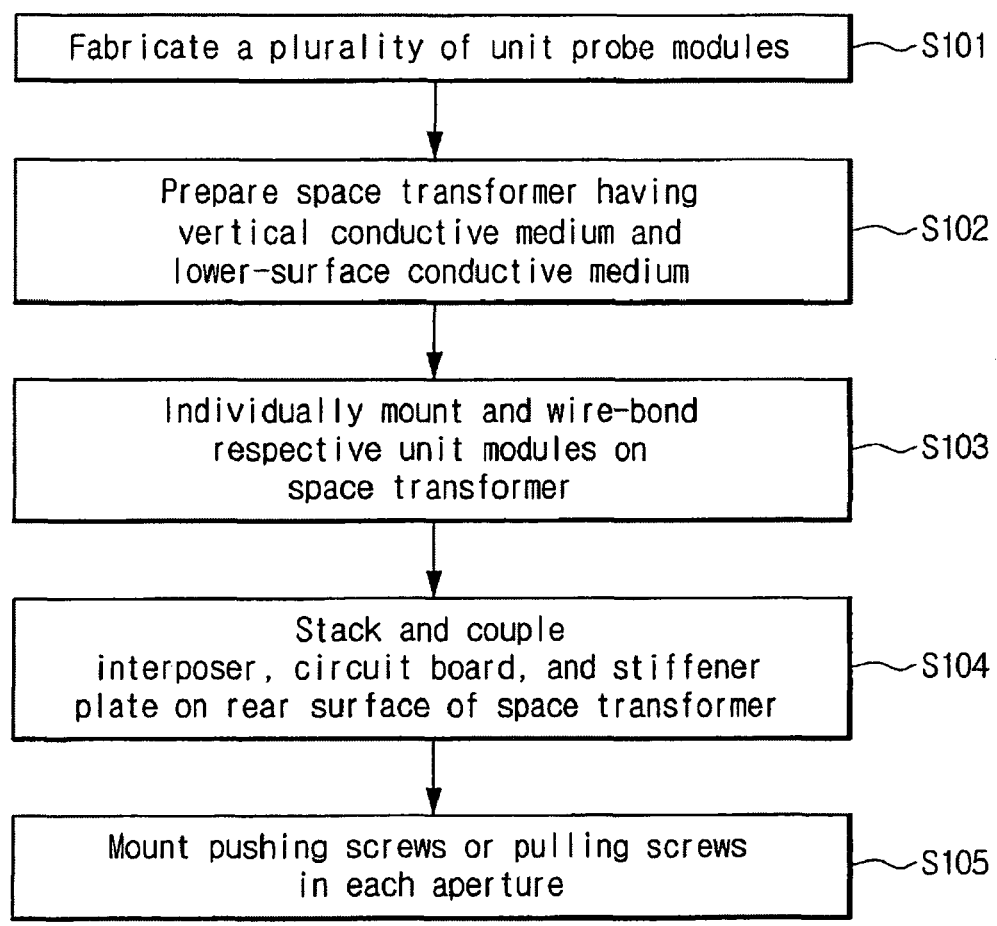
FIG. 11 is a flow chart for explaining a method for fabricating a probe card according to an exemplary embodiment.

A method for fabricating a probe card according to an exemplary embodiment will be described below. FIG. 11 is a flow chart for explaining a method for fabricating a probe card according to an exemplary embodiment. FIGS. 12, 13a to 13c, and 14a to 14c are process reference views for explaining a method for fabricating a probe card according to an exemplary embodiment.

An exemplary method for fabricating a probe card comprises forming a vertical aperture penetrating through a space transformer and positioning an vertical conductive medium in the formed vertical aperture, attaching a plurality of unit probe modules to be seated on positions spaced from the vertical conductive medium inserted in the space transformer, and electrically connecting the respective unit probe modules to the vertical conductive medium provided in the space transformer.

Figure 12:
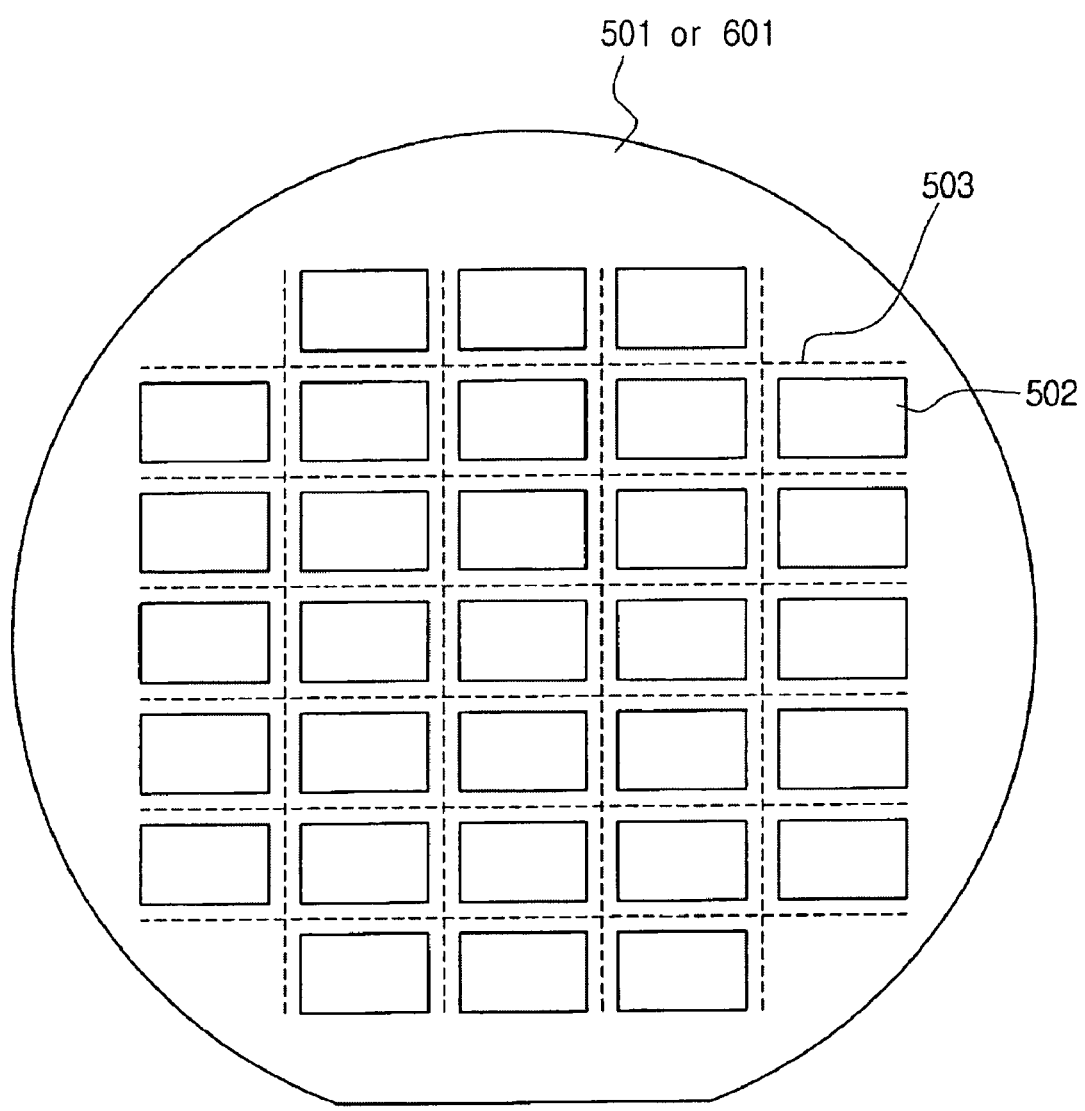

First, the unit probe module is fabricated as shown in FIG. 11 (S101). To this end, a substrate 501 and a silicon wafer 601 on which a plurality of unit probe module regions 502 are defined are prepared as shown in FIG. 12. As used herein, the unit probe module region 502 refers to a region in which one unit probe module is formed. Each unit probe module region 502 is divided by means of a scribe line in consideration of a subsequent unit probe module cutting process. Herein, as the substrate 501 a glass substrate or a ceramic substrate may be used and the size of the substrate 501 may be the same as the size of the silicon wafer 601. According to an aspect, the silicon wafer 601 has a <110> crystal direction.

Figure 13A:
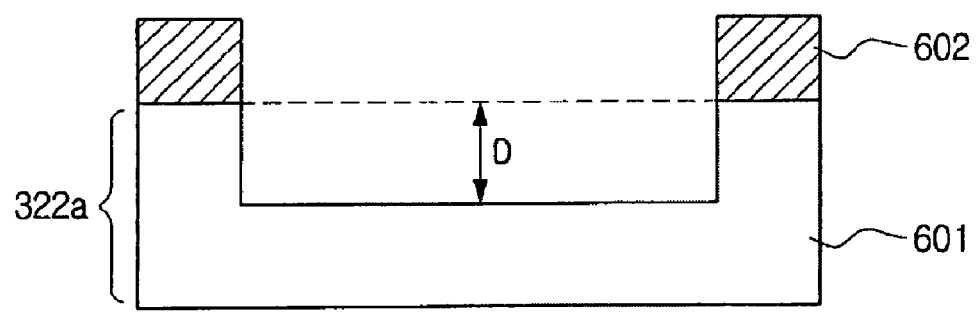

Next, a silicon oxide film or a silicon nitride film is formed on the silicon wafer 601 using any one of a thermal chemical vapor deposition (thermal CVD) method, a physical vapor deposition (PVD) method, and a plasma-enhanced chemical vapor deposition (PECVD) method, as shown in FIG. 13a. Then, the silicon oxide film or the silicon nitride film is selectively patterned through a photolithography process and an etching process to form an etch mask 602 defining micro cantilever forming regions.

In the state where the surface of the silicon wafer 601 corresponding to the micro cantilever forming region is exposed by the etch mask 602, the exposed silicon wafer 601, that is, the silicon wafer 601 in the micro cantilever forming region, is vertically etched at a depth of 5 to 500 μm through an anisotropic wet etching using KOH solution. With this, the micro cantilever in a pillar shape (322a) is formed and a space D in which the micro cantilever may be elastically deformed is assured.

Although not shown in the drawings, a conductive material is deposited on the substrate 501 and inverted patterns of the metal lines and pads are formed.

Figure 13B:
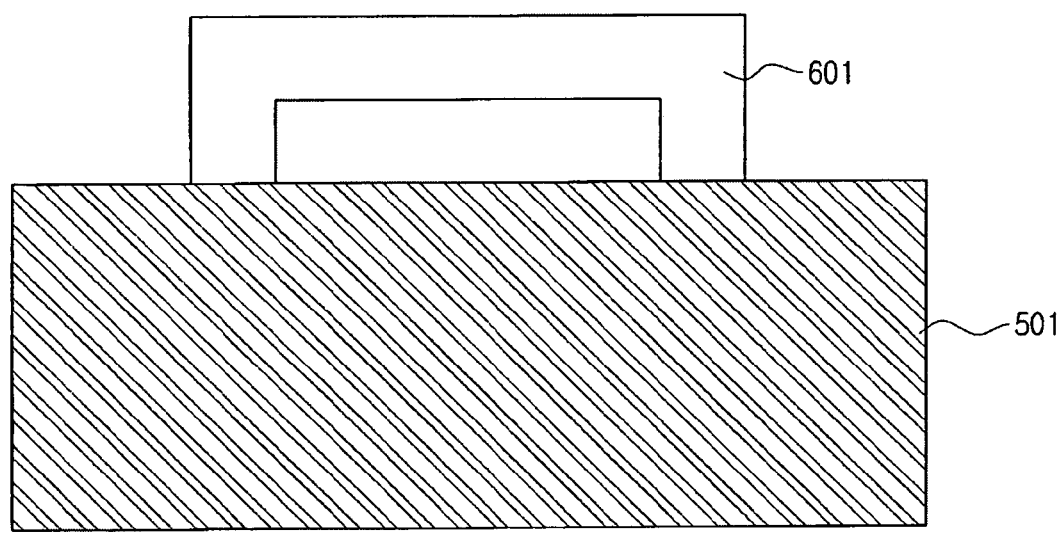

Next, the etched surface of the silicon wafer 601 contacts the substrate 501 as shown in FIG. 13b and a fusion bonding of the silicon wafer 601 to the glass substrate is then performed by applying a pressure between 1 to 5 atmospheric pressures at a temperature of 300 to 600° C. In addition to the fusion bonding, an anodic bonding of the silicon wafer 601 to the substrate 501 may be employed by applying a voltage of 100 to 2000 V and a current of 1 to 100 mA at a temperature of 200 to 500° C. in the state where the glass substrate contacts the silicon wafer 601.

Figure 13C:
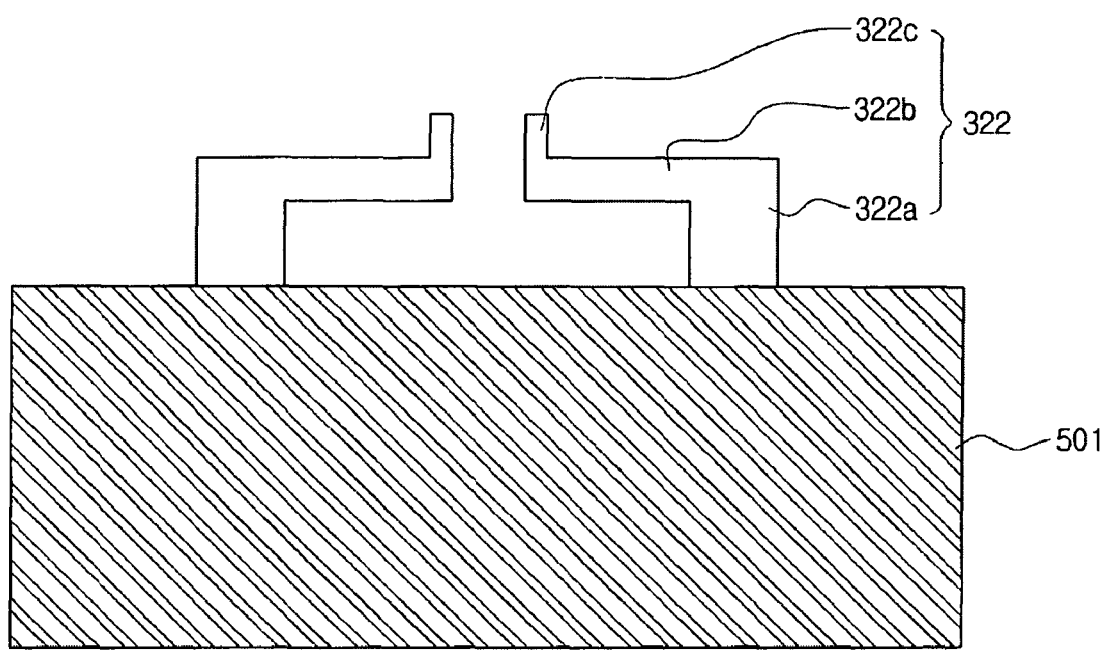

Thereafter, a photoresist pattern (not shown) defining the beam and tip of the micro cantilever is formed on the silicon wafer 601 through the photolithography process and the exposed silicon wafer 601 is etched using the photoresist pattern as the etch mask to form the beam 322b and tip 322c of the micro cantilever 322, as shown in FIG. 13c. According to an aspect, the silicon wafer 601 is etched by the anisotropic wet etching using KOH. In order to attain a preferred shape of the beam 322b and tip 322c of the micro cantilever 322, the photolithography process and the etching process may be performed several times. Meanwhile, the upper surface of the silicon wafer 601, that is, the surface of the silicon wafer 601 not contacting the substrate, may be machined into a proper thickness through a grinding process or a chemical mechanical planarization (CMP) process before the beam 322b and tip 322c of the micro cantilever are formed through the photolithography process and the etching process.

After the pillar 322a, the beam 322b, and the tip 332c of the micro cantilever 322 are completed through the above processes, although not shown in the drawings, the conductive material is deposited on the substrate and a lift-off process is performed so that the inverted pattern of the metal lines and pads formed on the substrate before performing the bond process of the substrate to the silicon wafer is removed and the desired metal lines and pads are formed, thereby completing the manufacturing of the unit probe module 320. Herein, the substrate is the probe body (reference number 321 of FIG. 6) of the unit probe module 320.

According to an aspect, the unit probe module 320 formed corresponds to the size of the semiconductor chip or has the size corresponding to 20 to 1000% of the semiconductor chip.

When the plurality of unit probe modules 320 are formed on the substrate 501, the substrate 501 is cut along the scribe line 503 to obtain the plurality of unit probe modules 320 with the same size. Then, a defect inspection on the respective unit probe modules 320 is performed to select the unit probe modules 320 with good quality.

Then, the space transformer 310 having an area corresponding to the wafer to be tested is prepared (S102). The space transformer 310 is provided with the vertical apertures 311 penetrating through the space transformer 310 and the vertical conductive medium 330 is inserted into the vertical apertures 311, as shown in FIG. 14a. For reference, vertical conductive medium 330 inserted in the vertical apertures 311 may be fixed in position by epoxy, etc. Also, the lower surface of the space transformer 310 is provided with the lower-surface conductive medium 340.

After the space transformer 310 is prepared, the unit probe modules 320 are transferred and mounted on the space transformer 310 using a transfer apparatus, for example, a vacuum chuck (S103). At this time, when transferring and mounting the unit probe module 320, the lower surface of body of the unit probe module 320 contacts the upper surface of the space transformer 310. When transferring the unit probe module 320, the transfer means picks up the upper surface of the body where the micro cantilever 322 are not formed, strictly speaking, the predetermined portion of upper surface of the body where the micro cantilevers 322 are not formed and transfers it. Also, the transfer means may pick up the side surface of the body and transfer it. When attaching the unit probe module 320 on the space transformer 310, the unit probe module 320 has to be accurately placed at a predetermined position on the upper surface of the space transformer 310 and the heights of the arranged unit probe modules 320 should be constant.

First, in order to accurately place the unit probe module at the predetermined position on the upper surface of the space transformer and in order to prevent misalignment, alignment marks may be formed on each of the upper surfaces of body of the unit probe modules 320 and the upper surface (or lower surfaces) of the space transformer 310 or the tip 321c of the micro cantilever 322 provided on the unit probe module 320 may be utilized as the alignment mark.

Subsequently, in order to make the heights of the unit probe modules 320 arranged on the space transformer 310 constant, the heights of the unit probe modules 320 may be maintained constant by interposing epoxy between the space transformer 310 and the unit probe modules 320 and controlling the thickness of the corresponding epoxy (see t1 and t2 of FIG. 5a). With this, the heights of the micro cantilevers 322 provided on the unit probe modules 320 are also maintained constant. The reason of controlling the heights of the unit probe modules 320 by controlling the thickness of epoxy is that the large area space transformer 310 does not have uniform flatness.

Figure 14B:
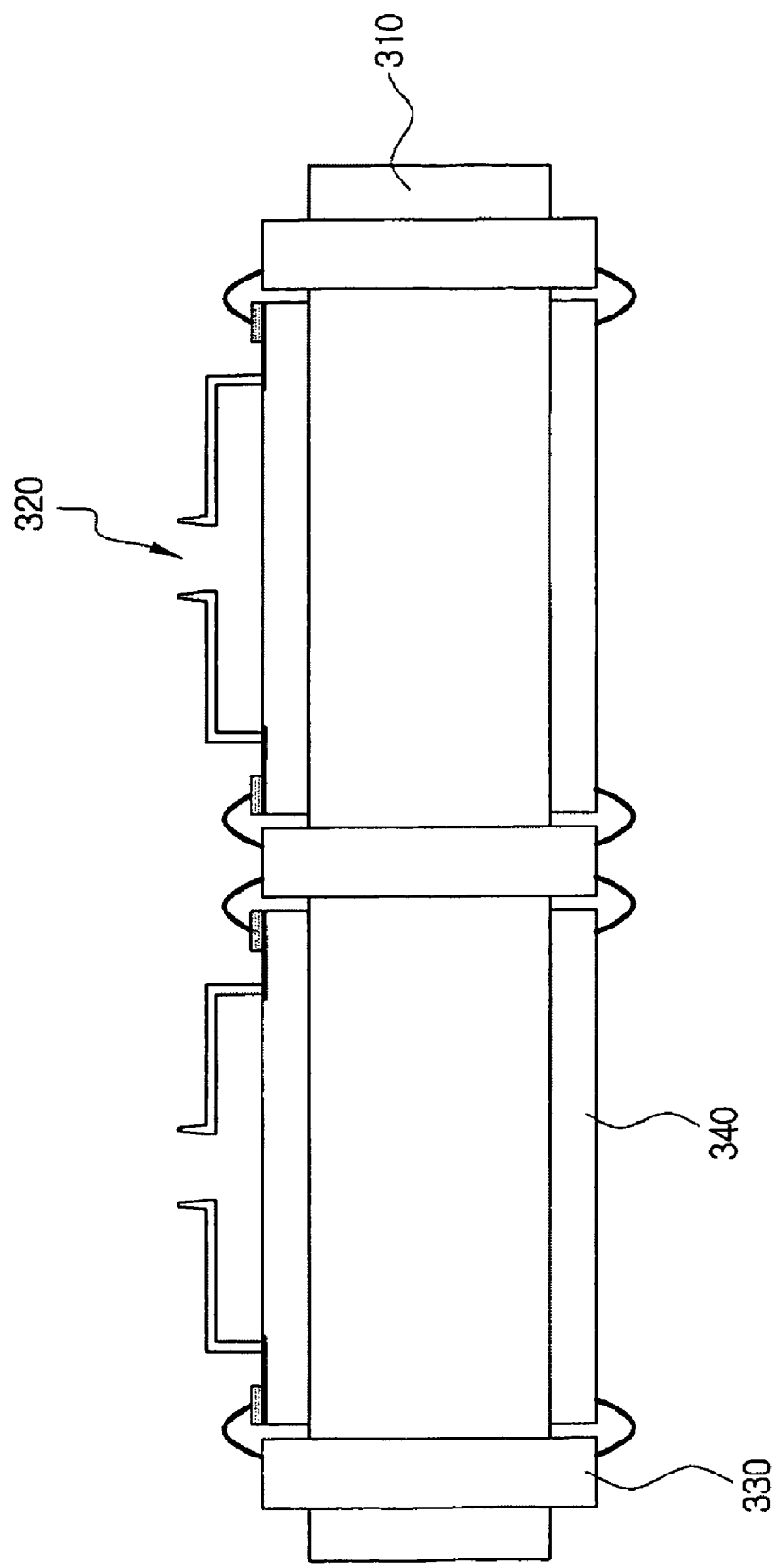

After the respective unit probe modules 320 are attached on the space transformer 310, the electrical connection from the unit probe modules 320 through the space transformer 310 is performed. In detail, the pads of the unit probe modules 320 are connected with the one side of the bonding pads 333 of the vertical conductive medium 330, and the opposite side the bonding pads 333 of the vertical conductive medium 330 are connected to the bonding pads 333 of the lower-surface conductive medium 340 by wire bonding (S103) as shown in FIG. 14b.

After the electrical connection between the respective unit probe modules 320 and the space transformer 310 is completed, the interposer 350, the circuit board 360, and the stiffener plate 370 are sequentially stacked on the rear surface of the space transformer 310 and are coupled to each other, as shown in FIG. 14c (S104). Herein, the interposer 350, which plays a role of electrically connecting the space transformer 310 and the circuit board 360, is formed of, for example, a pogo pin or a pressure conductive rubber (PCR). The stiffener plate 370, which plays a role of physically coupling and supporting the probe card comprising the space transformer 310, the interposer 350, and the circuit board 360, may be formed of stainless steel, etc.

After the interposer 350, the circuit board 360, and the stiffener plate 370 are coupled on the rear surface of the space transformer 310, the process of providing the pushing screw 372 and the pulling screw 373 is performed (S105). At this time, each of the stiffener plate 370, the circuit board 360, the interposer 350, and the space transformer 310 is provided with the plurality of apertures 371 and the apertures formed in each of the stiffener plate 370, the circuit board 360, the interposer 350, and the space transformer 310 are positioned to correspond to each other. Herein, the aperture 371 completely penetrates through the stiffener plate 370, the circuit board 360, and the interposer 350 and partly penetrates through the space transformer 310. Also, the screw thread is formed in the aperture 371 of the space transformer 310 so that the space transformer is coupled with the pulling screw 373 or the pushing screw 372. The respective apertures 371 may be formed at the positions that correspond to the portions where the unit probe modules 320 are attached or at the positions that do not correspond to the portions where the unit probe modules 320 are attached.

Then, the pushing screws 372 and the pulling screws 373 are provided in the respective apertures 371. The pushing screws 372 and the pulling screws 373 may be alternately provided in the apertures 371 or the pushing screws 372 and the pulling screws 373 may be selectively provided depending on the apertures 371.

As the pushing screws 372 and the pulling screws 373 are provided as such, the pushing screws 372 and the pulling screws 373 are selectively operated so that they may push or pull the space transformer 310 up or down. With this, the deformation of the space transformer 310 is prevented and in the case where the micro cantilever 322 of the particular unit probe module 320 is provided at higher position or lower position than the other micro cantilever 322, the position of the micro cantilever 322 of the corresponding unit probe module 320 may be corrected accurately.

A probe card and a method for fabricating the same according to an exemplary embodiment may provide one or more of the following advantageous effects.

The space transformer has an area corresponding to the area of the wafer to be tested, making it possible to facilitate the subsequent assembly of the space transformer, and the probe module provided on the space transformer has a size corresponding to the size of a semiconductor chip or has a size corresponding to 20 to 1000% of the size of the semiconductor chip, making it possible to improve the yield of the probe card.

Also, the side on which the micro cantilevers are not provided is safely seated on the space transformer when transferring the unit probe module, making it possible to improve alignment precision. Further, the particular portions of the space transformer may be selectively pulled or pushed by means of pushing screws and pulling screws provided in a rear surface of a stiffener plate, making it possible to assure a uniform flatness.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A probe card for testing semiconductor chips on a semiconductor wafer, the probe card comprising:
    a circuit board receiving electrical signals from outside;
    a plurality of unit probe modules to contact the semiconductor chips on the semiconductor wafer to transfer the electrical signals to the semiconductor chips, wherein each of the unit probe modules comprises a plurality of micro cantilevers to contact one of the semiconductor chips;
    a space transformer electrically connected to the circuit board and having the unit probe modules seated on an upper portion of the space transformer, wherein the probe modules are separated by intervals from each other on the space transformer, and the space transformer has vertical apertures penetrating through the space transformer; and
    a vertical conductive medium electrically connecting at least one of the unit probe modules to the circuit board, wherein the vertical conductive medium is inserted in one of the vertical apertures of the space transformer, and the unit probe modules are arranged at positions spaced from the vertical conductive medium;
    wherein the vertical conductive medium comprises a plurality of conductive patterns to transfer at least some of the electrical signals from the circuit board to the micro cantilevers through the vertical aperture in which the vertical conductive medium is inserted.

2. The probe card according to claim 1, wherein each of the unit probe modules has a size corresponding to a size of one of the semiconductor chips.

3. The probe card according to claim 1, wherein each of the unit probe modules has a size corresponding to 20 to 1000% of a size of one of the semiconductor chips.

4. The probe card according to claim 1, wherein the vertical conductive medium further comprises a printed circuit board comprising a plurality of insulating substrates; and
    the plurality of conductive patterns are provided at interfaces of the insulating substrates.

5. The probe card according to claim 4, wherein both ends of the conductive patterns are exposed to outside, bonding pads are provided on both ends of the conductive patterns, the bonding pads provided on one of the ends of the conductive patterns are exposed at an upper surface of the space transformer, and the bonding pads provided on the other ends of the conductive patterns are exposed at a lower surface of the space transformer.

6. The probe card according to claim 1, further comprising a capacitor provided on the vertical conductive medium.

7. The probe card according to claim 5, further comprising a capacitor provided on at least two of the bonding pads of the vertical conductive medium.

8. The probe card according to claim 6, wherein the space transformer is provided with a capacitor groove part providing a space to accommodate the capacitor when the space transformer and the vertical conductive medium are coupled.

9. The probe card according to claim 5, wherein the bonding pads exposed at the upper surface of the space transformer are wire-bonded to at least one of the unit probed modules.

10. The probe card according to claim 1, wherein each of the unit probe modules further comprises:
    a probe body seated on the upper surface of the space wherein the micro cantilevers are provided on an upper surface of the probe body;
    metal lines provided on the upper surface of the probe body and electrically connected to the micro cantilevers; and
    pads provided at one end of the metal lines.

11. The probe card according to claim 10, wherein a lower surface of the probe body is fixed on the upper surface of the space transformer by epoxy.

12. The probe card according to claim 11, wherein heights of the unit probe modules seated and fixed on the space transformer are made identical to one other by a thickness of the epoxy.

13. The probe card according to claim 1, further comprising a lower-surface conductive medium provided on a lower surface of the space transformer, the lower-surface conductive medium being electrically connected to each of the vertical conductive medium and the circuit board.

14. The probe card according to claim 13, wherein the lower-surface conductive medium comprises lands, metal lines, and bonding pads; and
    the bonding pads of the lower-surface conductive medium are wire-bonded to the vertical conductive medium.

15. The probe card according to claim 1, further comprising:
    an interposer provided between the space transformer and the circuit board; and
    a stiffener plate provided on a rear surface of the circuit board.

16. The probe card according to claim 15, wherein a plurality of apertures completely penetrate through the stiffener plate, the circuit board, and the interposer, and partly penetrate through the space transformer, so that respective portions of the apertures in the space transformer, the interposer, the circuit board, and the stiffener plate are aligned with one other.

17. The probe card according to claim 16, further comprising pulling screws provided in some of the apertures in the space transformer, the interposer, the circuit board, and the stiffener plate, and pushing screws provided in others of the apertures in the space transformer, the interposer, the circuit board, and the stiffener plate, the pushing screws and the pulling screws being selectively operable to push the space transformer up or pull the space transformer down.

18. The probe card according to claim 13, wherein the vertical conductive medium and the lower-surface conductive medium constitute an impedance-matched circuit board.

\* \* \* \* \*